(12) United States Patent
Khandekar et al.

(10) Patent No.: US 6,829,184 B2
(45) Date of Patent: Dec. 7, 2004

(54) APPARATUS AND METHOD FOR ENCODING AUTO-PRECHARGE

(75) Inventors: Narendra S. Khandekar, Folsom, CA (US); Michael W. Williams, Citrus Heights, CA (US)

(73) Assignee: Intel Corporation, Santa Clara, CA (US)

( * ) Notice: Subject to any disclaimer, the term of this patent is extended or adjusted under 35 U.S.C. 154(b) by 87 days.

(21) Appl. No.: 10/058,567

(22) Filed: Jan. 28, 2002

(65) Prior Publication Data

US 2003/0142557 A1 Jul. 31, 2003

(51) Int. Cl.[7] .................................................. G11C 7/00
(52) U.S. Cl. ....................... 365/203; 365/222; 365/204; 365/191
(58) Field of Search ................................ 365/203, 204, 365/222, 191

(56) References Cited

U.S. PATENT DOCUMENTS

| | | | |
|---|---|---|---|
| 5,926,828 A | 7/1999 | Khandekar | |
| 6,055,615 A * | 4/2000 | Okajima | 711/169 |
| 6,243,768 B1 | 6/2001 | Khandekar | |
| 6,292,015 B1 * | 9/2001 | Ooishi et al. | 326/33 |
| 6,301,183 B1 * | 10/2001 | Bondurant et al. | 365/222 |
| 6,330,636 B1 | 12/2001 | Bondurant et al. | |
| 6,438,055 B1 * | 8/2002 | Taguchi et al. | 365/222 |
| 6,438,066 B1 * | 8/2002 | Ooishi et al. | 365/233 |
| 6,507,900 B1 * | 1/2003 | Okajima | 711/169 |
| 2002/0163851 A1 * | 11/2002 | Jeong | 385/233 |

FOREIGN PATENT DOCUMENTS

| | | | | |
|---|---|---|---|---|
| JP | 407045087 A | * | 2/1995 | G11C/16/06 |
| WO | WO 94/28550 | | 12/1994 | |

* cited by examiner

Primary Examiner—Viet Q. Nguyen
(74) Attorney, Agent, or Firm—Blakely, Sokoloff, Taylor & Zafman LLP

(57) ABSTRACT

A technique to encode a precharge command on a flag signal used to execute data transfer to and from a DRAM.

24 Claims, 4 Drawing Sheets

APPARATUS AND METHOD FOR ENCODING AUTO-PRECHARGE

BACKGROUND OF THE INVENTION

In the area of memories, dynamic random access memories (DRAMs) typically perform as the main memory of a computer system. That is, in a typical computer system, such as a desk top personal computer (PC), the main memory function is performed by DRAM devices. The operation of a DRAM generally entails the use of row and column addresses for addressing the memory, so that read and write operations may be performed on the DRAM components. It is appreciated that in many instances, DRAMs are utilized with a processor, such as a central processing unit of a computer, but in other instances, the DRAM may be used with other processing/controlling devices, such as memory controllers.

In order to provide much higher performance in faster computer systems, higher performance requirements are also placed on DRAMs to process data in much larger quantities and in much faster performance time. Thus, it is not uncommon to find DRAMs configured into banks of DRAM arrays, in which data transfer to and from the DRAM arrays are achieved by high data speed bursts. For example, a high-speed 256 mega bit (Mb) DRAM, arranged in multiple banks, may be clocked to provided data transfer with an issuance of a read and/or write access command. In one such configuration, it may be possible to provide a specialized clocked signal (referred to as a flag signal) to trigger the data transfer in response to the read or write access to the DRAM. In some instances, the data transfer may be effected with both the rising and falling transitions of the flag signal. For example, a first read/write access may be triggered on a rising transition of such a flag signal, while a second read/write access may be triggered in response to the falling transition of the flag signal. This data transfer to/from the DRAM at both the rising and falling transitions of the flag signal may allow two memory accesses in response to one cycle of the flag signal. For example, such a scheme may be implemented so that data transfer to/from one portion of the memory may be achieved in response to the rising transition of the flag signal and a second data transfer occurs to/from another portion of the memory in response to the falling transition of the clock signal.

It is also generally understood that DRAM devices utilize a precharge function. Precharging a DRAM generally refers to an operation that charges the bit lines to a pre-selected value. An auto-precharge condition automatically precharges the bit lines in response to an issuance of a command, such as a read or write command. That is, in some instances a read or write command may initiate an auto-precharge of the accessed bit lines prior to performing the read or the write function. With most DRAMs, the precharge or auto-precharge function typically has a signal sent from a processor or controller to the DRAM device in order to perform the precharging operation. The command generally requires a specialized pin on the DRAM device to receive the precharge command. It is appreciated that if the precharging (or auto-precharging) is encoded with another signal being transmitted to the DRAM, then a designated pin need not be utilized for designating the precharge condition. This results in reduced pin count for the DRAM device, or alternatively the extra pin designated previously for the precharge/auto-precharge function may now be utilized for other signals being sent or received from the DRAM.

DETAILED DESCRIPTION OF THE INVENTION

Figure 1:
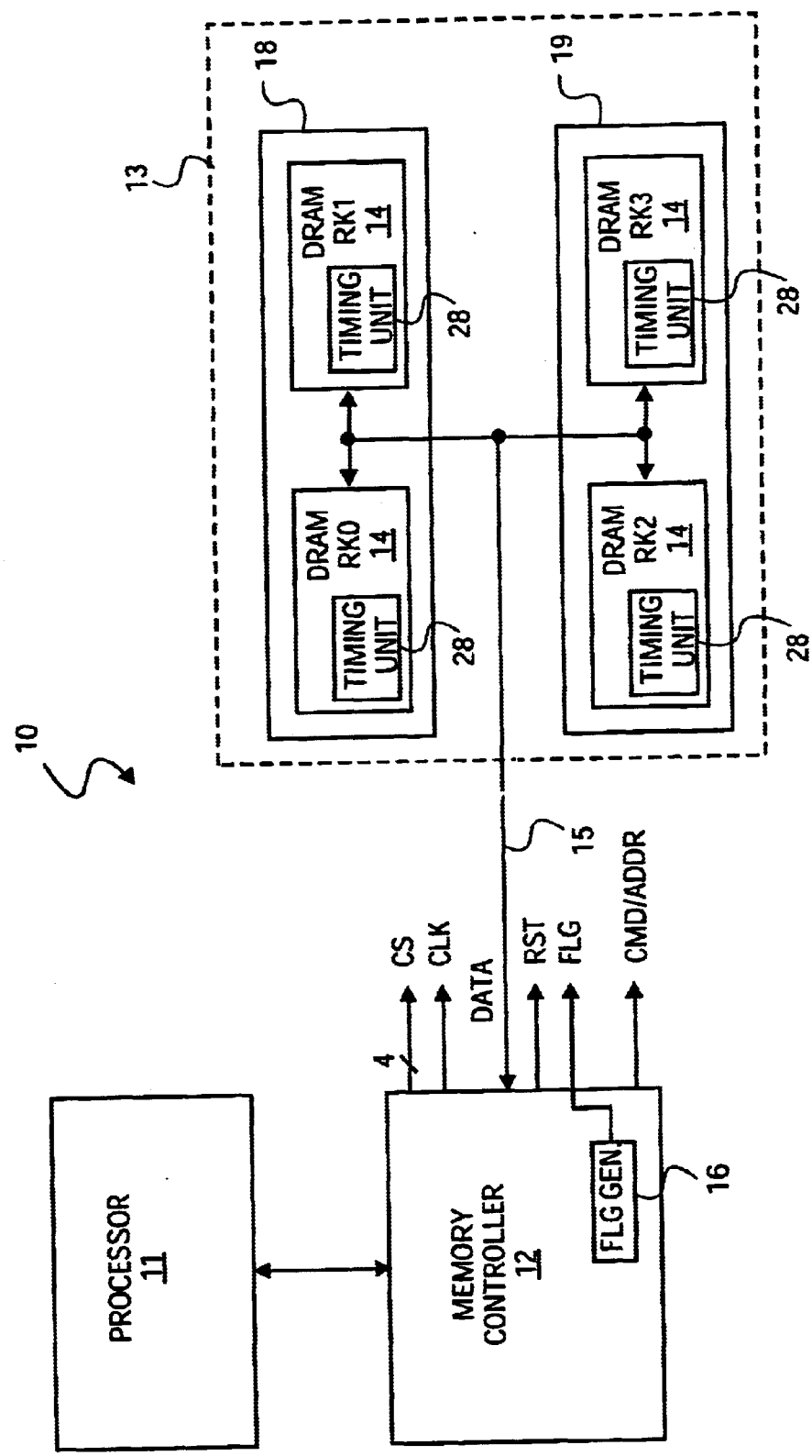
FIG. 1 is a block schematic diagram of a computer system utilizing a memory controller and a DRAM implementing an embodiment of the invention.

Referring to FIG. 1, an example computer system 10 is shown comprised of a processor 11, memory controller 12 and a memory 13, having a plurality of Dynamic Random-Access-Memory (DRAM) devices 14. In the example, the memory 13 has its DRAMs arranged in ranks (shown as RK0–RK3). The computer system 10 may be one of a variety of computer systems, including a Personal Computer (PC) system, in which case processor 11 may most likely be a central processing unit (CPU) of the PC. The processor 11 may also be comprised of a plurality of processors operating with one or more memory controllers 12. In the example computer system 10 of FIG. 1, the memory controller 12 provides controls to access the plurality of DRAMs 14 coupled to the memory controller 12. Typically the memory controller 12 provides the interface function between the processor 11 and memory 13 in order to transfer data to and from the DRAMs 14. In the embodiment of FIG. 1, memory controller 12 generates a variety of signals to memory 13 including the signals shown in FIG. 1.

The particular embodiment of the memory 13 has one or more DRAMs 14 configured into a grouping referred to as ranks. The example shows four ranks (RK0–RK3) of DRAM devices comprising the memory 13. It is appreciated that the number of such ranks may vary depending on the system configuration desired. The separation of the DRAMs 14 may be into other groupings defined differently than ranks. Furthermore, the DRAMs 14 may be categorized into various other types of groupings. For example, DRAMs may be configured to physical locations. In FIG. 1, RK0 is on one side of a Double Inline Memory Module (DIMM) 18, while RK1 is on the other side. Similarly, RK2 is on one side of another DIMM 19 and RK3 is on the other side of DIMM 19. Other arrangements may be utilized. In the description below a single DRAM is discussed, but the description is applicable to any number of DRAMs. Furthermore, the DRAMs 14 implement a timing unit 28, which is further described in reference to FIG. 2.

In the particular embodiment of the computer system 10, those signals and lines pertinent to the understanding of the operation of the DRAMs 14 and memory controller 12 are noted. However, it is to be noted that not all of these signals may be needed to practice the invention. As shown, a data bus 15 coupled to the DRAMs 14 provide the data transfer coupling between the DRAMs 14 and the memory controller 12 or any other component coupled to the bus 15. In a read operation, data is read from the selected DRAM 14 onto the bus 15, while in a write operation data on the bus 15 is written to the selected DRAM 14. The signals shown include a clock signal (CLK), a command flag signal (FLG), the command and address signal (CMD/ADDR), and the chip select signals (CS).

As will be note below, the CLK signal provides the timing control to clock the DRAM devices 14. The FLG signal, coupled to the DRAMs 14, controls the timing of the data transfer. Data may be read from the DRAMs 14 or data may be written into the DRAMs 14 in response to the FLG signal transition. The CMD/ADDR signal provides both command (CMD) and address (ADDR) information to the DRAMs 14. The CS signal selects a given rank of DRAM to be activated. Typically, a DRAM rank has its separate CS signal coupled from the memory controller 12. Thus, with four ranks of DRAMs shown, four separate CS signal couplings ensure that the correct DRAM device 14 activation may be achieved to select the appropriate DRAM 14 for reading or writing data from/to the memory 13. The memory controller 12 may also generate a reset signal (RST) to reset the DRAMs 14, however, some DRAMs may not utilize the reset feature.

As will be described also in reference to FIG. 2, the CMD/ADDR signal provides both command and address information to the DRAMs 14 of memory 13. It is appreciated that the command (CMD) and address (ADDR) information may be sent from the memory controller 12 to the DRAMs 14 in separate transmissions or the information may be multiplexed together in one transmission. The FLG signal controls the timing of the data read from memory (if a read command is invoked) or data write to memory (if a write command is invoked). That is, the FLG signal transition initiates the trigger to effect data transfer to/from the DRAM 14. The CS signal, coupled independently to the DRAMs, ensures that the correct rank may be selected for the data transfer.

Figure 2:
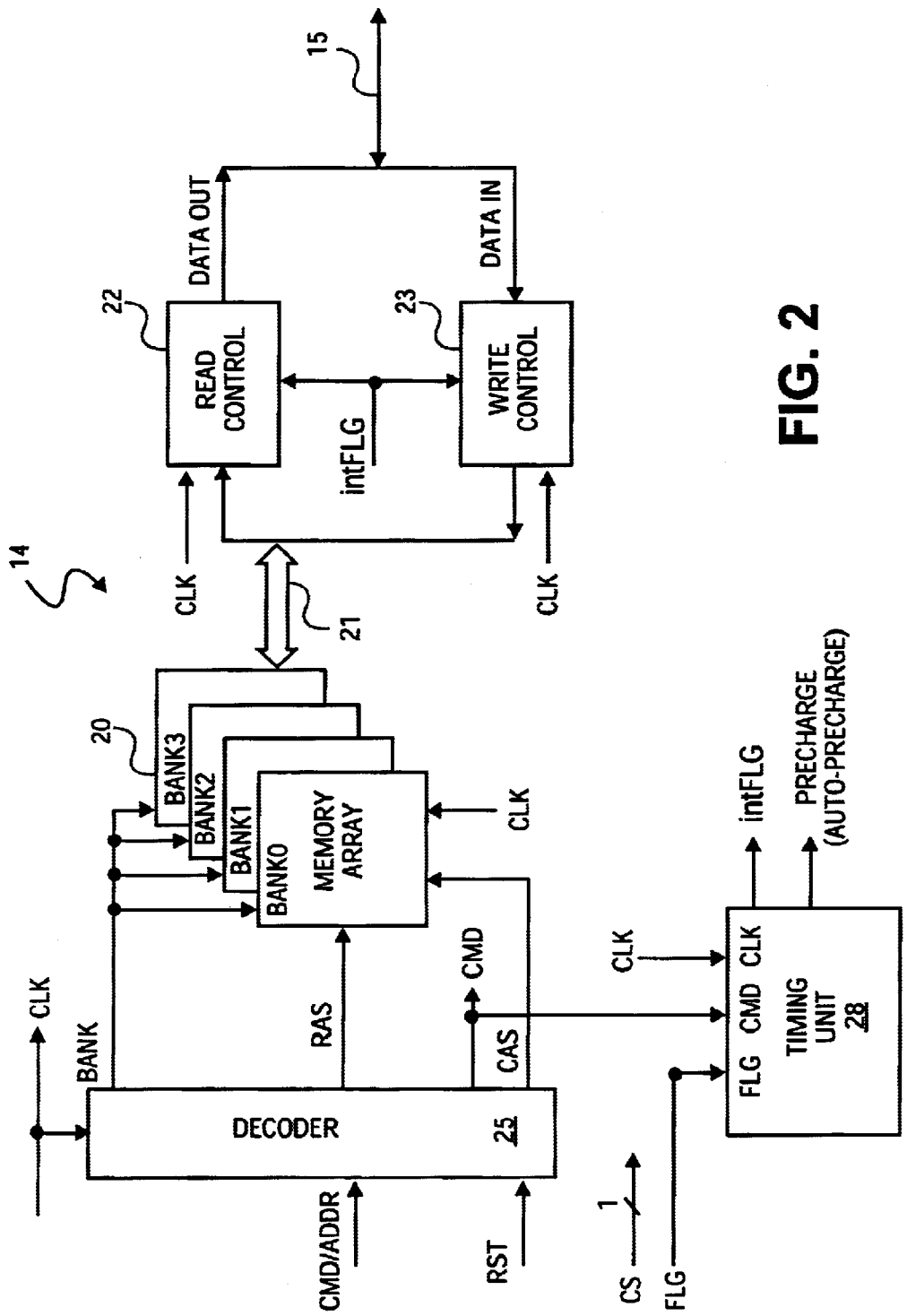
FIG. 2 is a block schematic diagram of a DRAM implementing a precharge.

In FIG. 2, a more detailed illustration of one of the DRAM devices 14 is shown. That is, FIG. 2 illustrates one embodiment of a DRAM device that may be implemented in any one of the DRAM ranks shown in FIG. 1. In the particular embodiment shown, the DRAM device 14 comprises a plurality of memory arrays 20. In the particular example shown, four banks (BK0–BK3) of memory arrays 20 comprise the actual memory storage components for DRAM 14. It is appreciated that the actual number of such banks may vary on the design of the particular DRAM device.

An internal data bus 21 couples the memory arrays 20 to a read control unit 22 and a write control unit 23. The read control unit 22 controls the transfer of the data from the memory arrays 20 to the data bus 15, in response to the memory controller invoking the read command. Likewise, write control unit 23 controls the data transfer from the data bus 15 to the selected memory array 20 in response to the memory controller invoking the write command. In some embodiments, the two control units 22, 23 may be combined into a single unit. The FLG signal controls the timing for triggering the data transfer onto/from the bus 15. It is to be noted that a variety of components typically comprise the circuitry implemented in the read control unit 22 and the write control unit 23. Generally these components include various latches, registers, buffers, drivers, and/or multiplexers. The actual circuitry implemented is not critical to the understanding of the present invention. What is to be understood is that data transfer between each DRAM unit 14 and the bus 15 may be effected by read and write control units (such as units 22 and 23), which control the timing (triggering) of the data transition between bus 15 and the DRAM units 14 by the timing provided by an internal flag (intFLG) signal, which is obtained from the FLG signal.

The CMD/ADDR signal is shown coupled to a decoder 25, which decodes the command signal and provides the command signal on the CMD line to the memory arrays 20.

The decoder 25 decodes the address component ADDR into a row, column and bank address signals, correspondingly shown as RAS, CAS and BANK signals in the particular embodiment of FIG. 2. The RAS provides the addressing to select the particular row of the memory array 20. Likewise the CAS provides the addressing to select the particular column of the memory array 20. The BANK signal selects one of the banks of the memory array 20. Thus, with the combination of the RAS, CAS and BANK, a particular row and column of a particular bank may be selected for data transfer. It is appreciated that some DRAM units may not be separated into multiple banks. In some instances, a portion of one or more of the addressing signals may be coupled to the read control unit 22 (or even to the write control unit 23) to select a particular multiplexed data line for selecting the data to be transferred. Furthermore, other signals typically implemented with DRAMs may not be shown in FIG. 2, since such signals may not impact the understanding of the workings of the invention.

The command signal CMD determines if a read or a write operation is to be performed to the selected address location. It is appreciated that the decoder 25 may be comprised of various other units including latches, registers, multiplexers and/or sequencers, which control the decoding and sequencing operations associated with the memory array 20.

Also as noted in FIG. 2, the reset signal RST is coupled to the decoder 25 to reset the DRAM, such as at initialization. Again, RST may not be present in some instances. The CLK signal is coupled to the various units/components 20, 22, 23 and 25 of DRAM 14. The FLG signal is coupled to the timing unit 28 to generate the internal flag signal intFLG, which is then coupled to the read control unit 22 and the write control unit 23 to control the response of these units 22, 23 to trigger the data transfer to/from the bus 15. Although not shown, it is to be noted that the CLK signal may be processed internally within DRAM 14 to generate one or more internal CLK (intCLK) signal(s), which may have slight timing differential from the received CLK signal. Also, the timing unit 28 may be located in the DRAM device itself, or alternatively, unit 28 may be located in another integrated circuit which works in combination with the rank of DRAMs.

Since the same CLK, FLG, and the CMD/ADDR signals are coupled to all of the DRAM units 14 of memory 13, the activation of a particular rank of DRAM 14 may be controlled by the chip select signal CS. Thus, with individual CS signals coupled to the DRAMs 14, the selection of a particular rank of DRAM 14 may be achieved by providing an indication of the corresponding CS signal. Thus, in FIG. 2 for the particular DRAM device shown, the CS input to the memory array 20 activates the memory array 20 in response to an occurrence of the CS signal corresponding to that rank.

Referring to both FIGS. 1 and 2, when the memory controller 12 accesses a particular DRAM rank, the CS signal selects the appropriate rank. The CMD component of the CMD/ADDR signal issues a read or a write operation. The ADDR component includes the bank, row and column information to address the selected address of array 20. Then, the intFLG transition following the read or write (RD/WR) command triggers the data to be read onto the bus 15 or written to the DRAM from the bus 15.

The intFLG transition may trigger the data transfer to/from the bus 15 on a rising transition (for example, rising edge), falling transition (for example, falling edge), or on both transitions. It is to be noted that some command structures may have two read and two write instructions if both FLG transitions are used to cause a data transfer. Thus, in one embodiment, the command structure may have read-with-rising flag (RDR), read-with-falling flag (RDF), write-with rising flag (WRR) and write-with falling flag (WRF) instructions to designate on which corresponding FLG signal transition, a given data transfer may occur. In other embodiments, only one read and one write instructions issue from the memory controller 12.

Independent of the types of read and write commands present, the corresponding FLG transition following a RD/WR command may need one or more clock periods to set the DRAM for the data transfer. The FLG signal is dormant of transitions in this period. Accordingly, this portion of the FLG signal may then be used to encode other information, including commands which may require a separate line to the DRAM.

Figure 3:
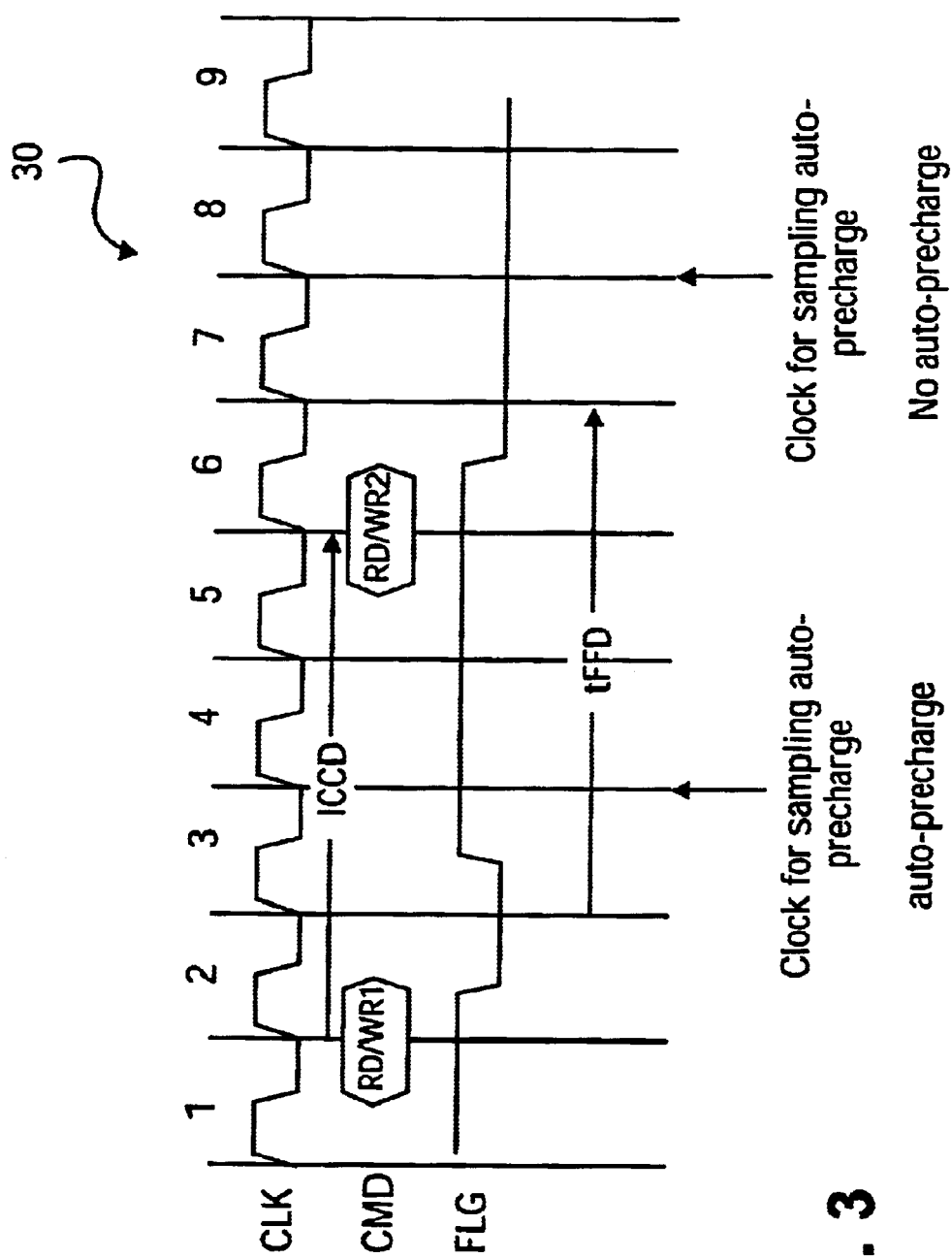
FIG. 3 is a timing diagram showing an encoding of a precharge command by placing a flag transition one clock period past a read or write command.

Referring to FIG. 3, a timing diagram 30 illustrates one operative implementation of the coding of the FLG signal with RDIWR commands. In the example embodiment, each CLK cycle is shown separated by a vertical line in which nine separate timing divisions are noted. Occurrences of read/write commands are also shown at every four timing intervals of the clock CLK. The command timing separation is shown as tCCD. In the shown example, the first read/write command signal RD/WR1 occurs in the portions of clock periods 1 and 2. The second RD/WR2 command signal occurs in the portions of clock periods 5 and 6. As noted in FIG. 3, the flag transition, whether rising transition or falling transition, may occur a specified clock period after the occurrence of the corresponding read-write command to trigger the data transfer. The example embodiment of diagram 30 shows the FLG transition four clock cycles after the occurrence of the corresponding RD/WR signal. Accordingly, the RD/WR2 signal also occurs at least four clock cycles after the occurrence of the RD/WR1 signal. The timing separation of the FLG transitions to effect data transfer is shown as iFFD in FIG. 3.

With the corresponding FLG transition occurring approximately four clock cycles after the occurrence of the RD/WR signal, a portion of the time period following the RD/WR signal may be noted as a dormant period, in which FLG transitions are not expected. An embodiment of the invention utilizes this dormant period to encode another command. Essentially, a separate command is coded (or multiplexed) onto the FLG signal. In the particular example, this command occurs in the first clock period following the RD/WR command. Furthermore, in the example, a precharge command is encoded one clock period after the occurrence of the RD/WR command. The encoding may be in various forms, but in the example, a FLG transition in a specified period following the period of the RD/WR occurrence signifies that that RD/WR command initiates a precharging of the bit lines. In the example, the specified time period is shown as one period of the clock.

In the particular embodiment, the memory controller 12 of FIG. 1 generates a precharge command within one clock period following the issuance of a read or write command, if a precharge is to be performed for that read/write command. This may be noted as an auto-precharge condition. A FLG generation circuit 16 generates the FLG command pursuant to the protocol established. An established protocol for a processor or controller, ensures that the associated FLG signal has a transition one clock period following the RD/WR signal, if the RD/WR requires the precharge. No transition occurs in the one clock period following the RD/WR signal if precharge is not needed. In either event, the corresponding FLG transition to trigger the data transfer occurs at a specified clock period established. This transition may be at the second clock period or greater, following the RD/WR signal. It is appreciated that a variety of circuitry (known to those skilled in the art) may be implemented for the FLG generation circuit 16.

Furthermore, as shown in FIG. 2, the timing unit 28 monitors the FLG and the CMD signals to determine if a transition of the FLG signal occurs within the specified period (again, noted as one clock period in the example) following the issuing of the RD/WR signal. If a FLG transition is detected in one clock period following the RD or WR command, then the timing unit 28 identifies this as a precharge command and generates internal precharge signals to effect the precharging of the bit lines. The timing unit 28 also generates the intFLG signal, which generally follows the transitions of the FLG signal, except that the intFLG transitions is not generated for the FLG transitions corresponding to the coded precharge command.

Accordingly, in FIG. 3, graph 30 illustrates one embodiment in which the first read/write signal RD/WR1 occurs in clock periods 1–2. The protocol may establish that approximately four clock periods may elapse between back-to-back read or write commands. That is, tCCD is four clock periods. Thus, the next read or write signal RD/WR2 occurs in clock periods 5–6. The FLG transition for the data transfer in response to RD/WR1 occurs at least two clock periods after RD/WR1 and generally within the same limits placed on the back-to-back read/write commands. Therefore, the FLG transition for RD/WR1 data transfer occurs in clock period 6 in FIG. 3. The tFFD period is set to 4 as well (same as tCCD) in the particular example.

Figure 4:
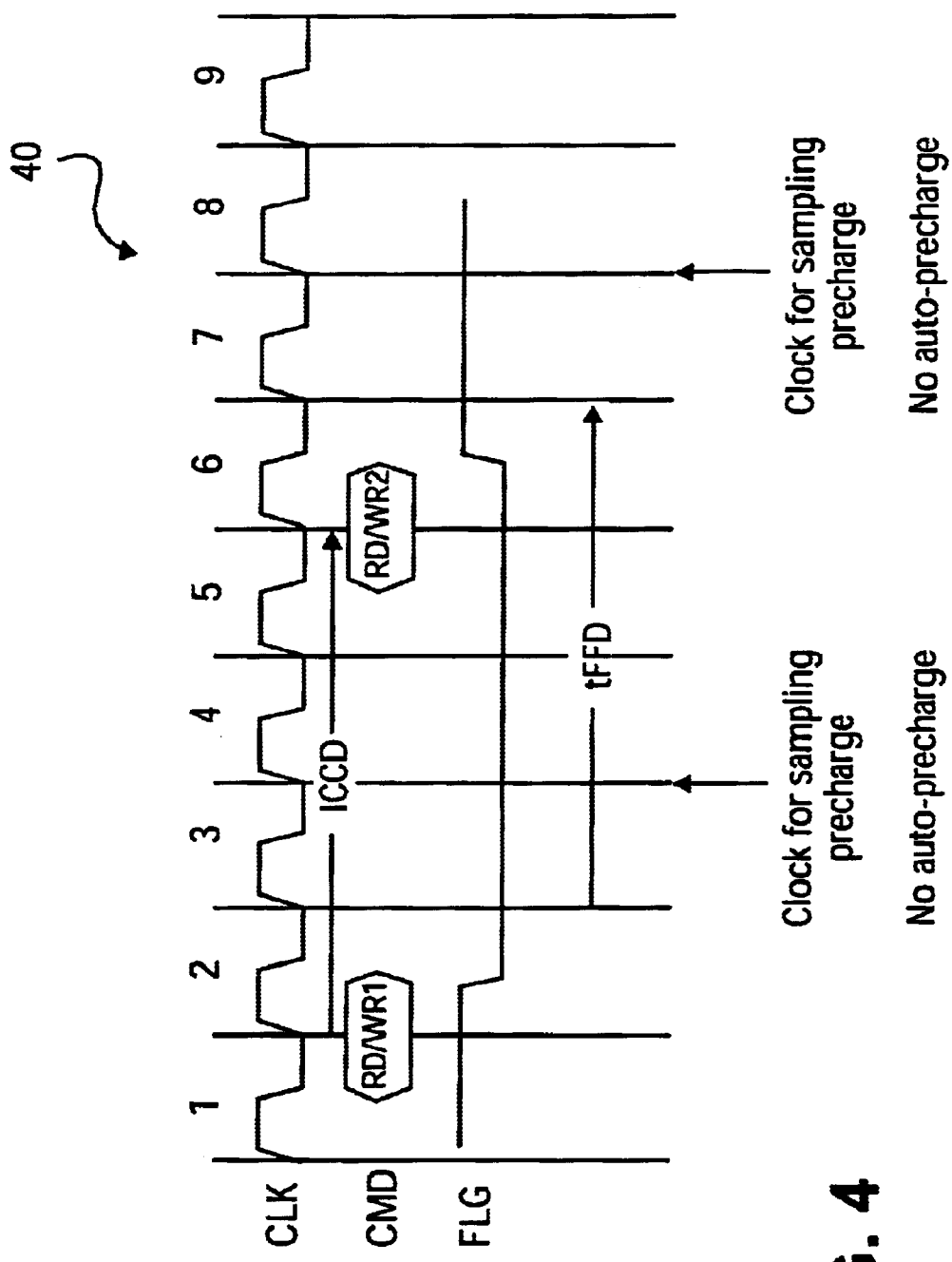
FIG. 4 is a timing diagram showing an absence of an encoded precharge command following a read or write command.

As noted, the FLG transition at clock period 3 encodes the precharge command and at the sampling point defined by the CLK transition between clock periods 3 and 4, the auto-precharge operation is initiated in the selected DRAM component. FIG. 4 illustrates the condition when the FLG signal does not have the precharge command encoded. As noted, no transition of the FLG signal occurs in the one clock period following the RD/WR1 command. The absence of a transition in this period indicates that coding for the auto-precharge is not present. This non-precharge condition is also noted in the clock period following RD/WR2 in FIG. 3.

Accordingly, a precharge command may be encoded within the flag signal which flags or triggers the data transfer to/from the DRAM component. In the example described above, the flag signal encodes a precharge command to perform auto-precharge. However, other commands may be encoded, instead of the precharge command. The flag signal may initiate a data transfer at both rising and falling edges, which is the case with the examples of FIGS. 3, 4. However, the flag signal may initiate the data transfer on the rising edge or, alternatively, on the falling edge. In that event, proper level reset may be effected after the occurrence of the transition indicating the precharge. Accordingly, a variety of design and protocols may be readily adapted to provide command encoding(s) with the flag signal used to execute the data transfer to/from the DRAM. By encoding a pre-charge command with another signal, a dedicated pin may not be needed to provide a precharge command to the DRAM, or other memory devices for that matter.

Thus, a scheme for encoding auto-precharge is described. It is to be noted that although a DRAM is described above, other devices (including other memory devices) may implement the invention. The invention need not be limited to a DRAM application only. Furthermore, although the second (or different command) to be implemented with the data transfer command (read and write commands as described above) is a type of precharge command, other embodiments may implement other commands than the precharge (auto-precharge) command described above. That is, commands other than precharge may be readily combined with the flag signal to convey instructions to the receiving device.

We claim:

1. An apparatus comprising:
   a controller to generate command signals to a device to access the device to transfer data between the device and a bus coupled to the device; and
   a flag signal generation unit to generate a flag signal to the device to trigger the data transfer between the device and the bus in response to a state transition that occurs in the flag signal after a specified period following a data transfer command, but said flag signal to also initiate a different command than the data transfer command in response to a state transition that occurs in the flag signal within the specified clock period.

2. The apparatus of claim 1 wherein the data transfer command is a read or write command and the different command is a precharge command.

3. The apparatus of claim 2 wherein the device is a memory device.

4. The apparatus of claim 1 wherein the memory device is a dynamic-random-access-memory, DRAM, which responds to a read or a write command to perform a corresponding data transfer between the DRAM and the bus if the flag signal has a transition after the lapse of a specified clock period, but first performs an auto-precharge on at least one bit line of the DRAM selected for the read or the write command if the flag signal has a transition within the specified clock period following the read or the write command.

5. The apparatus of claim 4 wherein the specified clock period is one clock period following the data transfer command.

6. An apparatus comprising:
   a memory array to couple to a data bus to transfer data between said memory array and bus in response to a command signal received to initiate the data transfer; and
   a timing unit coupled to receive the command signal to initiate the data transfer and also coupled to receive a flag signal to trigger the data transfer, said timing unit to interpret the flag signal to determine if the flag signal has a transition prior to a lapse of a specified clock period following the command signal and to perform a different command operation than data transfer, if the flag signal has a transition prior to the lapse of the specified clock period following the command signal.

7. The apparatus of claim 6 wherein the command signal is to perform a read or write operation and the different command operation is a precharge operation.

8. The apparatus of claim 6 wherein said timing unit generates an internal flag signal to trigger the data transfer if a transition of the flag signal occurs after the specified clock period following the command signal, but to generate an auto-precharge signal if a transition of the flag signal occurs prior to the lapse of the specified clock period following the command signal.

9. The apparatus of claim 8 wherein the command signal is to perform a read or write operation and the different command operation is an auto-precharge operation.

10. The apparatus of claim 9 further including a decoder coupled to the memory array to decode the command signal and at least one control circuit to perform the data transfer between said memory array and the data bus.

11. The apparatus of claim 10 wherein the apparatus is a dynamic-random-access-memory, DRAM.

12. The apparatus of claim 10 wherein the specified clock period is one clock period following the data transfer command.

13. A system comprising:
    a controller to generate a data transfer command signal to effect data transfer and also to generate a flag signal to time triggering of the data transfer;
    a memory device coupled to said controller to receive the data transfer command signal and transfer data in response to the data transfer command signal;
    a bus coupled to said memory device to transfer data between said memory and bus in response to the data transfer command signal;
    said controller to generate the flag signal to the memory device to trigger the data transfer between the memory device and the bus in response to a state transition that occurs in the flag signal after a specified clock period following the data transfer command signal, but said flag signal to also initiate a different command signal than the data transfer command signal in response to a state transition that occurs in the flag signal within the specified clock period; and
    said memory to receive and interpret the flag signal to determine if the flag signal has a transition within the specified clock period following the command signal and to perform a different command operation from data transfer, in response to a transition present in the specified clock period following the data transfer command signal.

14. The system of claim 13 wherein said memory device is a dynamic-random-access-memory, DRAM.

15. The system of claim 14 wherein the different command signal is a precharge command.

16. The system of claim 13 wherein the data transfer command is a read or write command and the different command is an auto-precharge command associated with the read or write command.

17. The system of claim 16 wherein said controller is a memory controller.

18. The system of claim 16 further comprising a processor, wherein said controller is a memory controller coupled to said processor.

19. A method comprising:
    issuing a command signal;
    generating a flag signal in response to the issuing of the command signal to trigger a response to a corresponding operation of the command signal after a lapse of a specified time period following the issuing of the command signal; and
    coding a different command on the flag signal by having the flag signal transition within the specified time period following the issuing of the command signal to perform a different operation than the corresponding operation of the command signal.

20. The method of claim 19 further comprising receiving the command and flag signals and interpreting the flag signal to determine if a transition is present within the specified time period following the issuing of the command signal.

21. The method of claim 20 wherein the different operation of the different command signal is a precharge operation of a memory.

22. The method of claim 20 wherein the command signal issues a read or write command to memory to perform a read or write operation.

23. The method of claim 22 wherein the different operation of the different command signal is an auto-precharge operation, which is performed prior to performing the read or write operation.

24. The method of claim 23 wherein the command and flag signals, including the coding of the different command signal in the flag signal, are issued to a dynamic-random-access-memory, DRAM.

* * * * *

UNITED STATES PATENT AND TRADEMARK OFFICE
CERTIFICATE OF CORRECTION

PATENT NO. : 6,829,184 B2
DATED : December 7, 2004
INVENTOR(S) : Khandekar et al.

It is certified that error appears in the above-identified patent and that said Letters Patent is hereby corrected as shown below:

Column 5,
Line 19, delete "RDIWR" and insert -- RD/WR --.

Signed and Sealed this

Sixteenth Day of August, 2005

JON W. DUDAS
*Director of the United States Patent and Trademark Office*